United States Patent [19]

Muso

[11] Patent Number: 5,631,821
[45] Date of Patent: May 20, 1997

[54] COOLING SYSTEM FOR ELECTRIC VEHICLE INVERTER SYSTEM

[75] Inventor: Masanori Muso, Hitachinaka, Japan

[73] Assignee: Hitachi, Ltd., Tokyo, Japan

[21] Appl. No.: 361,674

[22] Filed: Dec. 22, 1994

[30] Foreign Application Priority Data

Dec. 27, 1993 [JP] Japan ................... 5-331005

[51] Int. Cl.$^6$ ........................... H05K 7/20
[52] U.S. Cl. ........................... 363/141; 361/709
[58] Field of Search ............... 363/141; 310/64, 310/65; 361/676, 677, 688, 689, 699, 701, 702, 709; 165/42, 80.4, 80.5

[56] References Cited

U.S. PATENT DOCUMENTS

| | | | |
|---|---|---|---|
| 4,039,921 | 8/1977 | Yoshida et al. | 363/22 |
| 5,164,893 | 11/1992 | Luscher et al. | 363/141 |
| 5,497,289 | 3/1996 | Sugishima et al. | 361/709 |
| 5,508,908 | 4/1996 | Kazama et al. | 363/141 |

*Primary Examiner*—Matthew V. Nguyen
*Attorney, Agent, or Firm*—Antonelli, Terry, Stout & Kraus, LLP

[57] ABSTRACT

A cooling system is provided for an electric vehicle inverter system having an inverter for converting electric power from a battery into alternating current and for supplying the current to a driving motor for driving the vehicle. The cooling system employs a heat sink having an internal coolant flow passage for conducting a liquid coolant which is forced to recirculate. The heat sink is vertically placed on a mounting base, and heat generating parts are placed and fixed on at least one side of said heat sink. In this way, a cooling system for an electric vehicle inverter system which is small in size and large in cooling capacity with a simple construction is easily provided.

11 Claims, 5 Drawing Sheets

COOLING SYSTEM FOR ELECTRIC VEHICLE INVERTER SYSTEM

BACKGROUND OF THE INVENTION

The present invention relates to a cooling system for an electric vehicle inverter system and, more particularly, to a cooling system for an electric vehicle inverter system which is capable of effectively cooling the inverter in an inverter system.

It has been known to use a cooling system of the water cooling type instead of the using a cooling system of air cooling type in order to cool an electric power converting apparatus (inverter system) mounted on an electric vehicle, as described in, for example, Japanese Patent Application Laid-Open No. 4-275492 (1992).

In a cooling system of this type, the cooling of each of a number of electric power converting units provided in an electric vehicle is performed by a single cooling system formed as a unit, and cooling is classified into two patterns, a battery charging pattern and a running pattern, to selectively cool a battery charger and a DC/DC converter operating during battery charging, as well as an inverter and a DC/DC converter operating during running.

For cooling an IGBT (insulated gate bipolar transistor) and the like, it has been common to use a heat sink of the air cooling type, as described in, for example, Japanese Patent Application Laid-Open No. 47-31317 (1972).

According to the former publication, an excellent cooling system of the water cooling type is provided since cooling is performed with forced convection and the main part of the inverter is locally and effectively cooled. However, there is a disadvantage in that it is difficult to directly employ the system for commercial use in an electric vehicle because of insufficient capacity of the available space and a weight bearing problem.

In the latter system of the air cooling type, there are many air heat sinks to cool heat generating bodies, such as IGBT's, and a duct, a blower and the like are required to conduct the cooling air to the fins of the heat sinks. The units are large in size and require a large room when these units are mounted on a vehicle, which decreases its during efficiency. In addition to this, since a large air flow rate and high outlet pressure are required, the blower makes a large noise.

SUMMARY OF THE INVENTION

An object of the present invention is to provide a cooling system for an electric vehicle inverter system which is small in size and large in cooling capacity, while having a simple construction.

The above-stated object of the present invention can be attained by providing a cooling system for an electric vehicle inverter system including an inverter to convert electric power from a battery into alternating current to supply the electric current to a driving motor for driving the vehicle wherein a heat sink having a coolant passage to conduct a liquid coolant to be forced to recirculate is supported on a mounting base vertically, and heat generating parts inverter system arranged and fixed on at least one side surface of said heat sink.

It is preferable to arrange heat generating parts requiring water-proof conditions on one side surface and cover them with a water-proof cover, and arrange heat generating parts not requiring water-proof conditions on the other side surface.

According to the present invention, by forced recirculation of the coolant, such as water in the coolant passage of the heat sink, the heat sink will be actively cooled and IGBT's and a snubber resistor operating as switching parts attached to the heat sink will be effectively cooled by radiating heat.

Further, a contactor and the like are placed on the opposite side of the heat sink from the side where said switching parts are placed. Therefore, it is possible to obtain a small-sized and compact inverter in which the generated heat on each side is effectively radiated and does not thermally interfere with each other.

DETAILED DESCRIPTION OF THE PREFERRED EMBODIMENTS

Embodiments according to the present invention will be described below, referring to the accompanying drawings.

Figure 1:
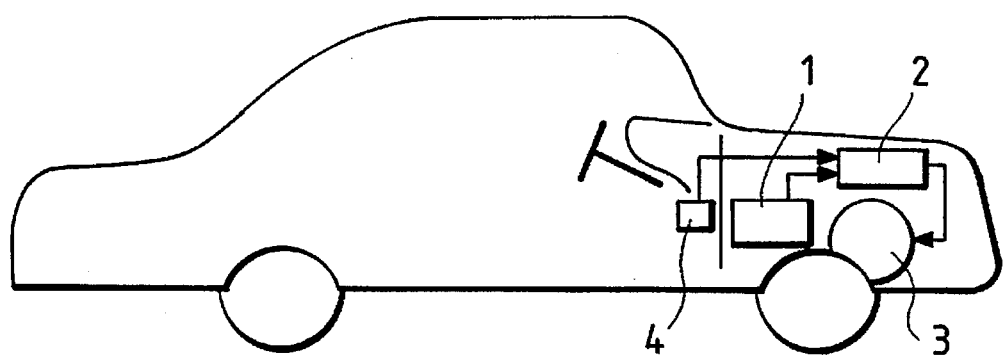
FIG. 1 is a diagrammatic view showing a vehicle having a system according to the present invention.
Figure 2:
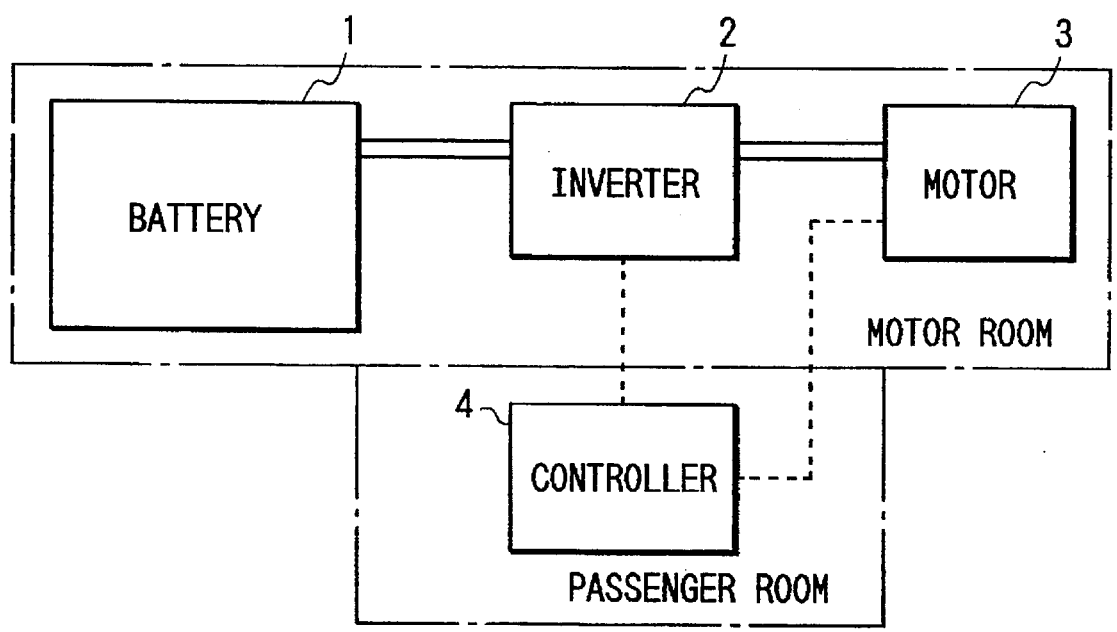
FIG. 2 is a block diagram showing the connection of parts in the system according to the present invention.

FIG. 1 is a schematic view showing an electric vehicle having a driving system. The main parts are composed of a battery 1, an inverter system 2, and a motor 3 which are located in a motor compartment, and a control unit 4 is placed in a passenger compartment of the vehicle. The inverter system 2 converts the direct current from the battery 1 into alternating current using the inverter system 2 to supply the motor 3 with electrical power. The control unit 4 sends driving command signals to the inverter system 2 to control the rotating speed and the torque of the motor 3, as seen in FIG. 2.

Figure 3:
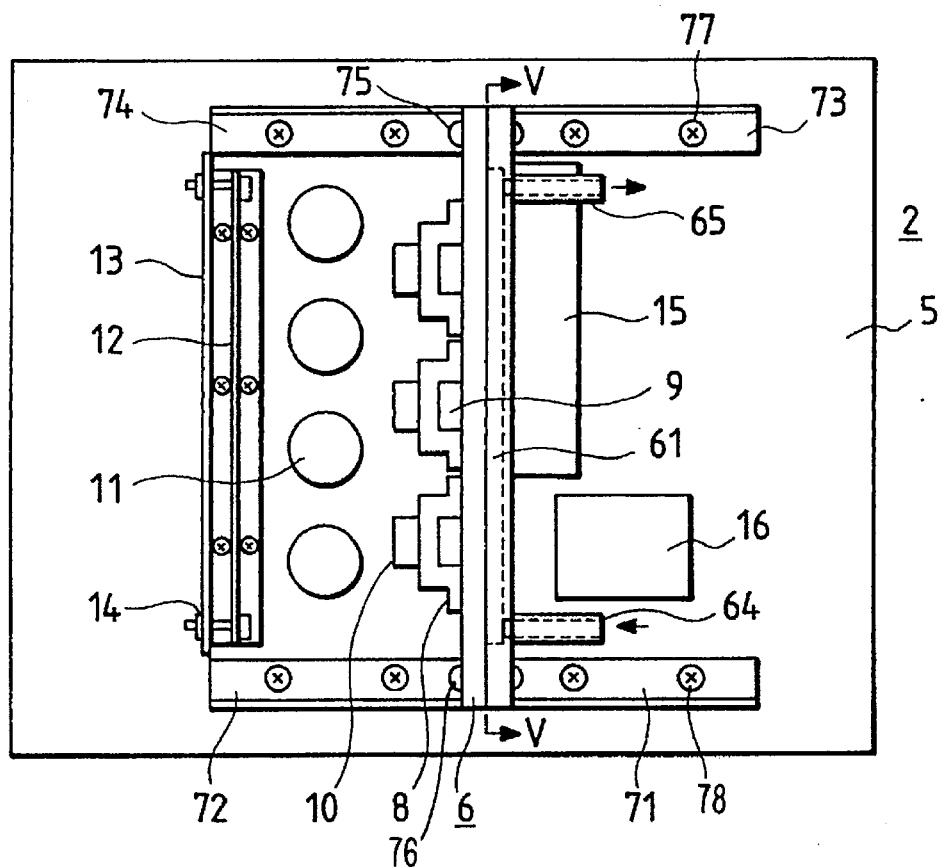
FIG. 3 is a plan view showing the arrangement of parts of an inverter system.
Figure 4:
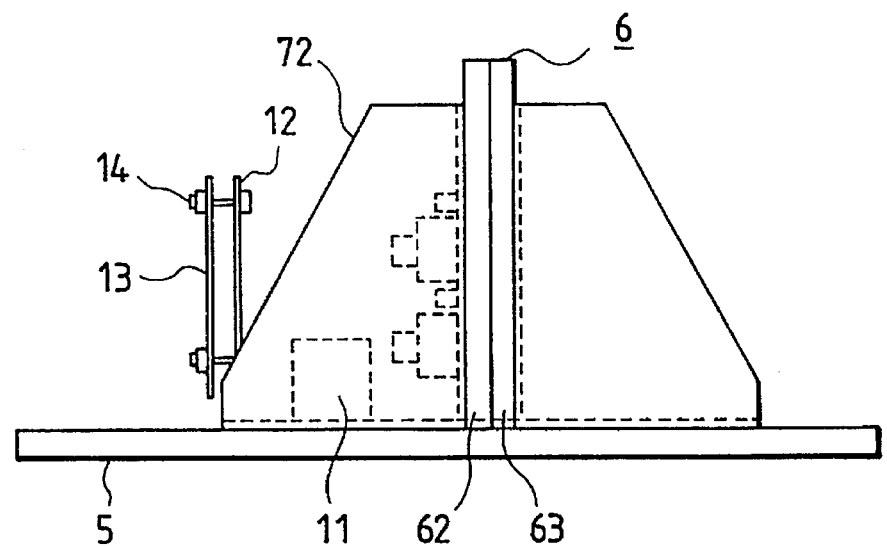
FIG. 4 is a side view of FIG. 3.

An embodiment of an inverter system, which represents a main part of the present invention, will be described below. As shown in FIG. 3, a heat sink 6 made of aluminum and formed with a coolant flow passage 61, shown in FIG. 5 and FIG. 6 in detail, is vertically placed in the middle on a flat plate base 5 made of aluminum material, and both ends of the heat sink are supported by and fixed with fixing screws 75, 76 to heat sink brackets 71, 72, 73, 74 made of aluminum thin plate. The brackets are fixed to the base with fixing screws 77, 78.

Figure 5:
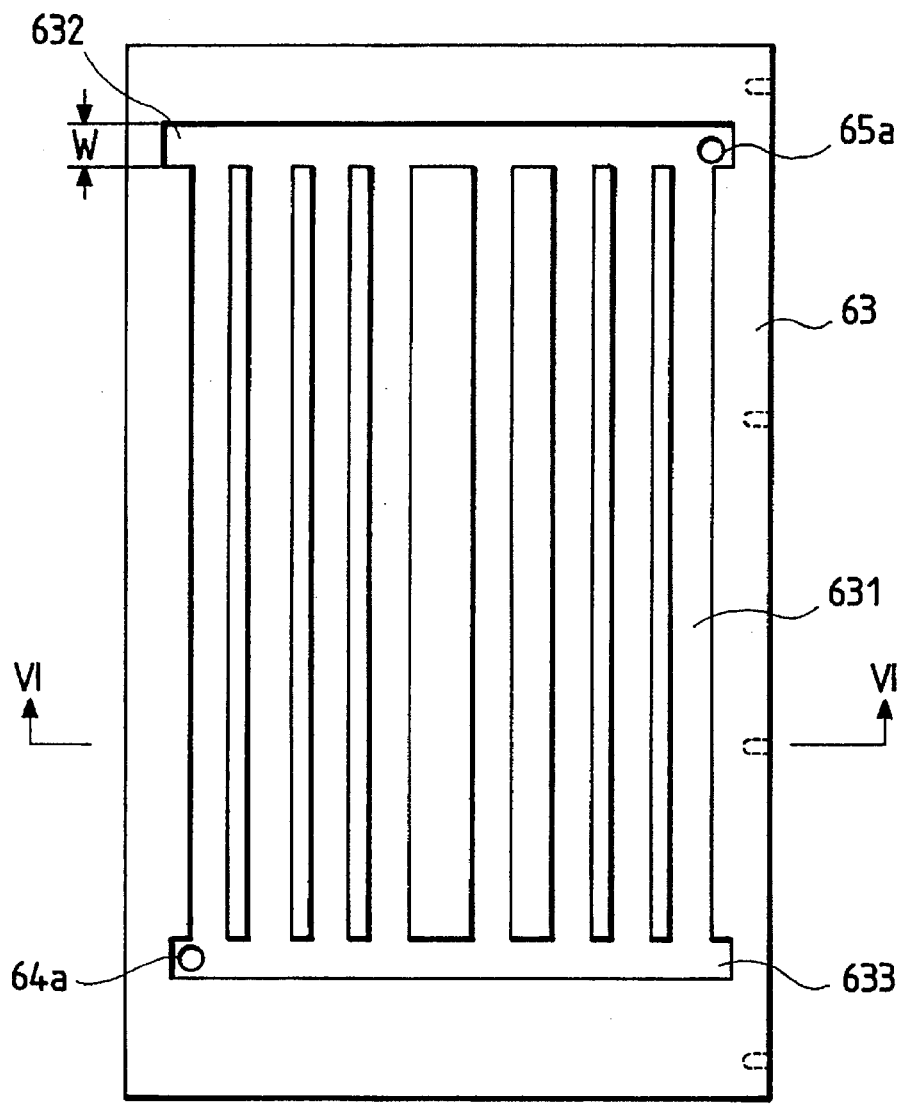
FIG. 5 is a cross-sectional view taken along the line V—V of FIG. 3.
Figure 6:
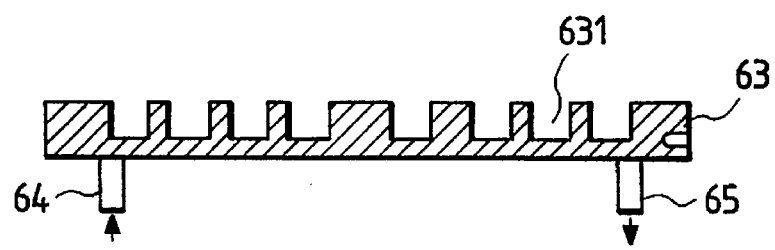
FIG. 6 is a cross-sectional view taken along the line VI—VI of FIG. 5.

The heat sink 6 is formed of a pair of elements 62, 63 which are jointed together. There are formed a plurality of lateral passages 631, as seen in FIG. 5 and FIG. 6, extending in the lateral direction and vertical passages 632 and 633 having the width of W connecting the end portions of the lateral passages on the flat surface portion of one of the elements 63, as shown in FIG. 5. There are an inlet passage 64a and an outlet passage 65a in opposite positions a the diagonal line across said coolant passage to which an inlet pipe 64 and an outlet pipe 65 are connected, respectively, as shown in FIG. 6.

A brazing material is interposed between the pair of elements 62, 63 composing said heat sink and said brazing material is melted by passing the heat sink 6 through a furnace to join the elements together. Here, the inlet pipe 64 and the outlet pipe 65 are preferably jointed to the heat sink element 63 in advance with brazing or torch welding, which leads to a preferable mass production effect.

A plurality of IGBT's 8 and a plurality of snubber resistors 9 forming a switching part are installed in direct contact to one side of said heat sink 6 using screws, and snubber capacitors 10 are also fixed to the top surfaces of said IGBT's together with wiring panels using screws. A plurality of electrolytic capacitors 11 are placed near the snubber capacitors and are fixed to the base 5 through mounting screws. A printed circuit board 13 is placed and fixed to a board bracket 12, using mounting bolts 14, in parallel to the board bracket, which is vertically fixed on the base 5 in parallel to said electrolytic capacitors 11.

A DC/DC converter 15 is also fixed to the opposite side surface of said heat sink 6 using screws to utilize both of the surfaces of the heat sink as cooling surfaces effectively. The numeral 16 indicates a contactor which is placed near the DC/DC converter 15 and is fixed to the base 5 using screws.

Figure 7:
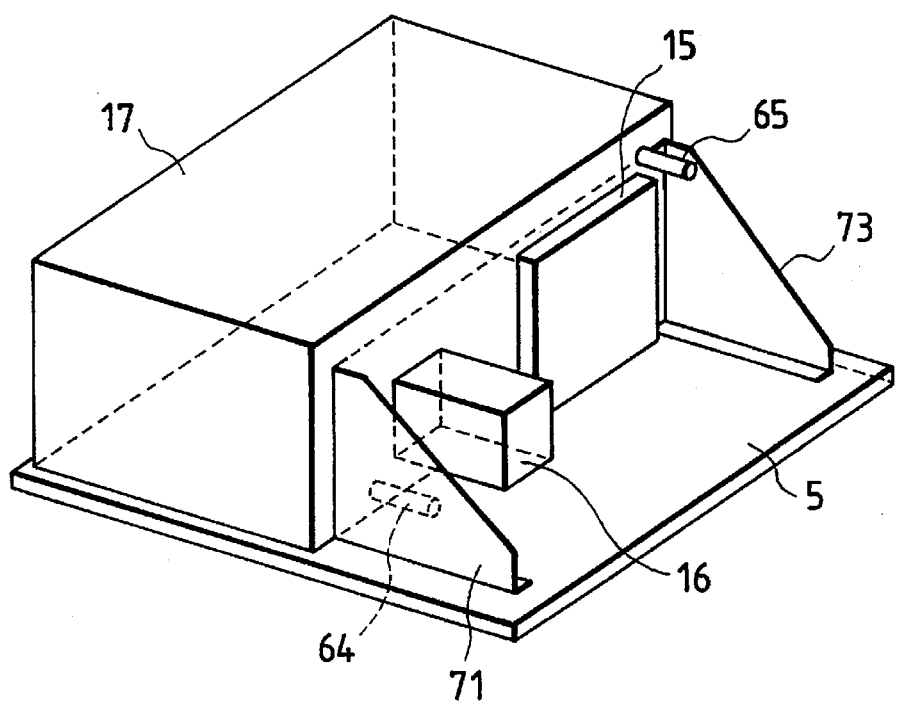
FIG. 7 is a perspective view showing an inverter system.

All of the parts on the side of the IGBT's 8 of the inverter system 2 constructed as described above are covered with a water-proof cover 17, which is fixed to the base 5, as seen in FIG. 7, to protect the parts from water drops entering into the motor compartment. The DC/DC converter 15 and the contactor 16 can be formed as to be of water-proof construction, and therefore there is no need to cover them.

In the structure described above, the temperature at the IGBT's mounting position on the heat sink 6 can be decreased by leaving spaces between them, and it is confirmed that a space of at least 10 mm gives a preferable temperature distribution. By arranging the snubber resistor in the space between the IGBT's, it is possible to obtain the effect of decreasing the temperature at the IGBT's mounting positions and the effect of using the space effectively at the same time. In FIG. 7, the numeral 17 is the water-proof cover, a numeral 64 is the inlet pipe, the numeral 65 is the outlet pipe, and the numerals 71, 73 are the heat sink brackets.

In FIG. 5, the width W of the vertical passages 632 and 633 in the inlet side is selected so as to optimize the pressure drop. When the width W is small, the pressure drop increases as the flow rate is increased. When the width W is too large, the pressure drop due to flow in a sudden enlargement increases. Therefore, the optimum value for the width W is selected according to design specification.

In the construction described above, a coolant (antifreeze compound) is introduced from the inlet pipe 64. Since the lateral passages 631 are arranged so as to provide the same distance from the inlet passage 64a to the outlet passage 65a, the coolant flows uniformly to the vertical outlet passage 633 from the vertical inlet passage 632 through the lateral passages 631 to cool the inverter system actively and effectively.

Figure 8:
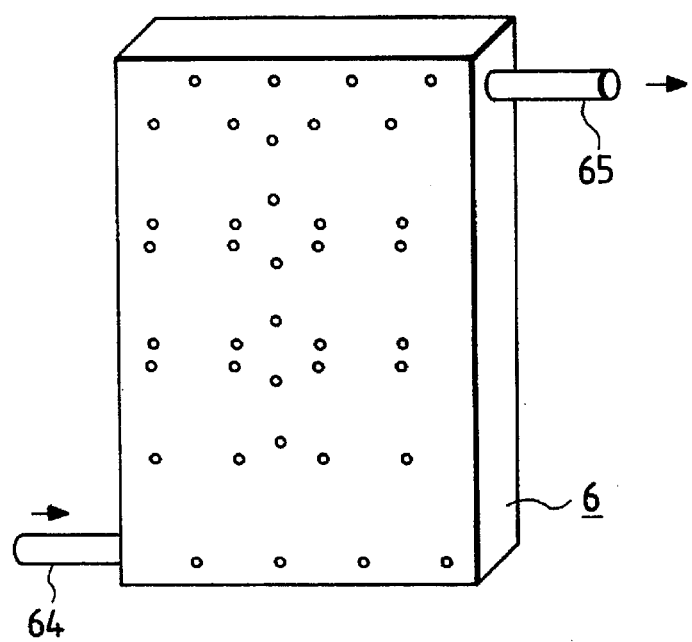
FIG. 8 is a perspective view showing a heat sink.

FIG. 8 shows another form of a heat sink where an inlet pipe 64 and an outlet pipe 65 are placed in parallel to the lateral passages in the lateral direction. In this construction, the pressure drop can be decreased by 30% compared to the heat sink where the coolant flows vertically to the mounting surface.

Figure 9:
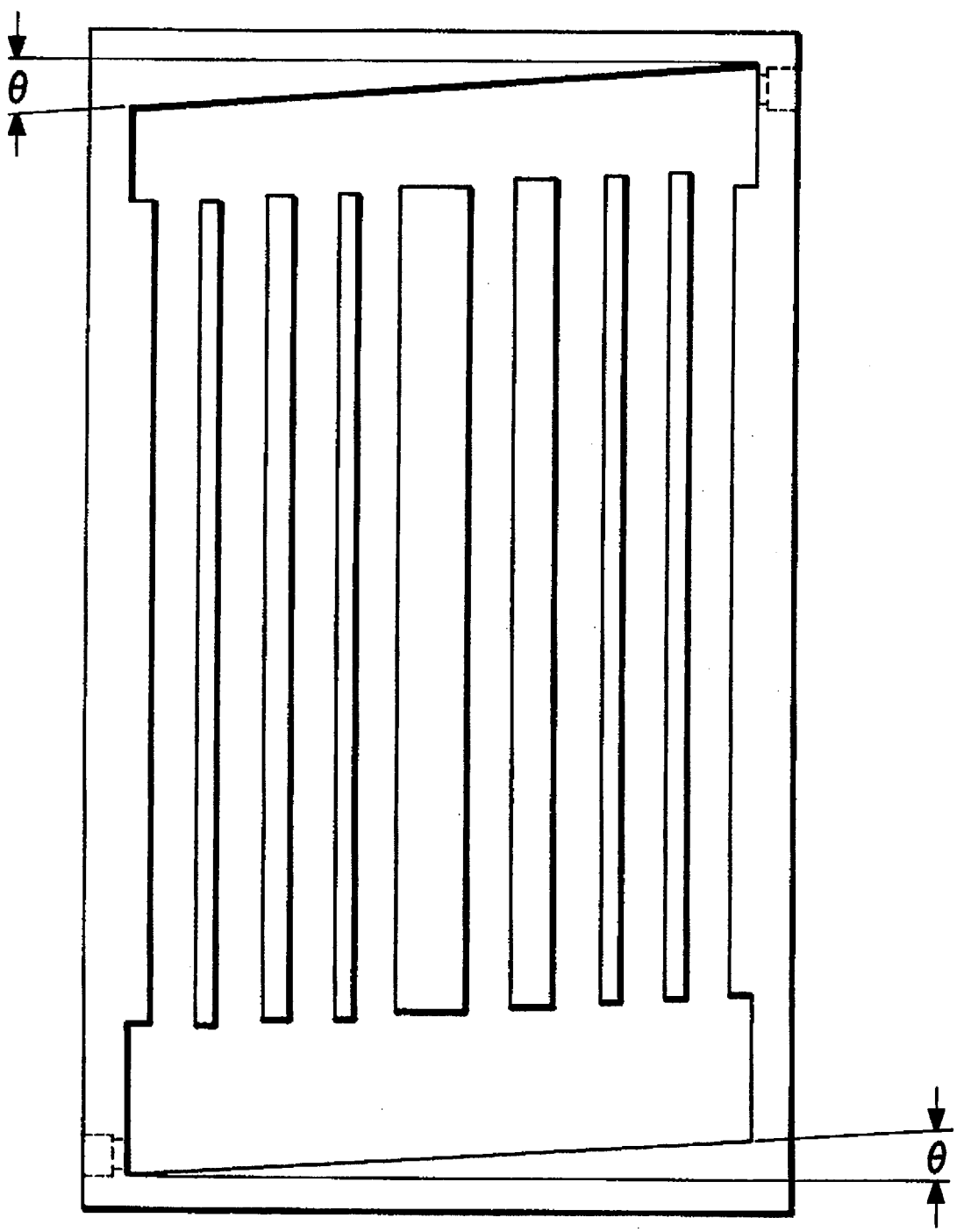
FIG. 9 is a front view showing another form of a heat sink.

FIG. 9 shows a further form of a heat sink in which the pressure drop further decreases and the flow distribution to each of the passages is made uniform by further modifying the heat sink having the inlet pipe 64 and the outlet pipe 65 oriented in the lateral direction, as shown in FIG. 8. In this embodiment, the vertical passages 632a, 633a expand with an inclining angle toward the inlet pipe 64 and the outlet pipe 65, respectively. That is, the pressure drop can be decreased and the flow distribution can be flattened by providing an expanding or contracting angle of $\theta=10\sim15°$ along the coolant flow passage.

According to the embodiment of the present invention, the parts of the inverter which are required to be water-proof are separated from the parts not required to be water-proof, the parts requiring a water-proof environment having an increased sealing capability by using a base, a heat sink, a case cover, a packing and screws. Thereby, a compact inverter can be obtained.

Since the heat sink is vertically fixed near the center of the base with brackets, the parts to be cooled can be placed on both surfaces of the heat sink, and, therefore, the cooling surface can be effectively used and the inverter can be made small in size.

Since the printed circuit board is held in the base with the board bracket and the bracket can protect the board against an undesirable influence, such as a surge, stable signals can be transmitted to the controller.

Since a board the for control unit can be also placed inside the inverter and, therefore, the wiring connecting between the control unit and the inverter is almost unnecessary, the performance (anti-surge capability) is improved, the occupied area is minimized and the cost efficiency is improved.

Since there is a space of more than 10 mm between the IGBT's, the temperature at the IGBT mounting surface is decreased and the temperature distribution on the IGBT mounting surface can be made more uniform. And, by arranging the snubber resistors between the IGBT's, the space factor on the configuration is improved.

Since a heat sink having many interval coolant passages improves the temperature distribution on the cooling surface and the grooves are formed by using two plates and jointing them with brazing, a small sized and light weight heat sink can be formed.

By optimizing the size of the vertical passages (tank portion) of the heat sink and selecting an optimum expanding inclining angle in the vertical passage, the pressure drop can be substantially deceased, a uniform coolant flow distribution can be attained, and then a large effect can be obtained in cooling performance.

As has been described, in accordance with the present invention, by vertically installing a heat sink, having a coolant flow passage to conduct a liquid coolant which is forced to recirculate, on a mounting base, and placing and fixing heat generating parts on at least one side of said heat sink, it is possible to provide an inverter system for an electric vehicle which is small in size and has excellent cooling performance with a simple construction.

What is claimed is:

1. A cooling system for an electric vehicle inverter system including an inverter for converting electric power from a battery into alternating current and for supplying the current to a driving motor for driving the vehicle, comprising: a heat sink having a coolant flow passage for conducting a recirculating liquid coolant, said heat sink being vertically supported on a mounting base; and heat generating parts of said inverter placed and fixed on at least one side of said heat sink.

2. A cooling system for an electric vehicle inverter system including an inverter for converting electric power from a battery into alternating current and for supplying the current to a driving motor for driving the vehicle, comprising: a heat sink having a coolant flow passage for conducting a recirculating liquid coolant, said heat sink being vertically supported on a mounting base; and parts of the inverter requiring a water-proof environment being arranged on and adjacent to one side surface of said heat sink and being covered with a water-proof cover, while parts of said inverter not requiring a water-proof environment being placed on and adjacent to the other side surface of said heat sink.

3. A cooling system for an electric vehicle inverter system according to any one of claim 1 and claim 2, wherein said heat sink is composed of a pair of elements and is formed by jointing said elements to each other, at least one of said elements having a coolant flow passage formed therein.

4. A cooling system for an electric vehicle inverter system according to claim 2, wherein the parts of the inverter requiring a water-proof environment and which are placed on said one side of the heat sink include IGBT's, snubber resistors, an electrolytic capacitor, and a print board relatively positioned with respect to the heat sink.

5. A cooling system for an electric vehicle inverter system according to any one of claim 1 and claim 2, wherein a bracket for board is provided between a print board and parts composed of IGBT's, snubber capacitors, an electrolytic capacitor and, said print board being placed and fixed to said bracket.

6. A cooling system for an electric vehicle inverter system according to any one of claim 1 and claim 2, wherein switching parts are fixed on one surface of said heat sink and a DC/DC converter is fixed on the opposite surface of the heat sink.

7. A cooling system for an electric vehicle inverter system according to any one of claim 1 and claim 2, wherein said heat sink is composed of a pair of elements which are jointed through a brazing material.

8. A cooling system for electric vehicle inverter system according to any one of claim 1 and claim 2, wherein the coolant flow passage of the heat sink is formed of a pair of vertical flow passages and a plurality of lateral flow passages connecting the vertical flow passages, the heat sink including an inlet pipe connected to one vertical flow passage and an outlet pipe connected to the other vertical flow passage.

9. A cooling system for an electric vehicle inverter system according to claim 8, wherein said inlet pipe and said outlet pipe are attached so as to be directed in the same direction as the direction of said lateral flow passage.

10. A cooling system for an electric vehicle inverter system according to claim 9, wherein said vertical flow passages narrow with an inclining angle in directions toward said inlet pipe and said outlet pipe, respectively.

11. A cooling system for an electric vehicle inverter system according to claim 10, wherein said inclining angle is in the range between 10° and 15°.

* * * * *